(12) United States Patent
Uchida et al.

(10) Patent No.: US 7,282,276 B2
(45) Date of Patent: Oct. 16, 2007

(54) ORGANIC ELECTROLUMINESCENT DEVICE

(75) Inventors: Osamu Uchida, Odawara (JP); Jun Ogasawara, Minami-ashigara (JP); Satoshi Sano, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/266,303

(22) Filed: Nov. 4, 2005

(65) Prior Publication Data

US 2006/0240285 A1    Oct. 26, 2006

(51) Int. Cl.
*B32B 19/00* (2006.01)
(52) U.S. Cl. .................. 428/690; 428/917; 257/40
(58) Field of Classification Search ............... 546/48, 546/42, 47, 49; 428/690, 917; 544/342, 544/183, 338, 233, 184, 245, 179, 180; 313/504
See application file for complete search history.

(56) References Cited

U.S. PATENT DOCUMENTS

| | | | | |
|---|---|---|---|---|
| 2001/0006741 | A1* | 7/2001 | Ishikawa et al. | 428/690 |
| 2004/0100190 | A1* | 5/2004 | Kim et al. | 313/504 |
| 2004/0126616 | A1* | 7/2004 | Iwasaki et al. | 428/690 |
| 2005/0014020 | A1* | 1/2005 | Yoneyama et al. | 428/690 |
| 2006/0083944 | A1* | 4/2006 | Igarashi et al. | 428/690 |

FOREIGN PATENT DOCUMENTS

| | | |
|---|---|---|
| JP | 8-12600 A | 1/1996 |
| JP | 2001-335516 A | 12/2001 |

OTHER PUBLICATIONS

Fang-Chung Chen, Shun-Chi Chang, Gufeng He, Seungmoon Pyo, Yang Yang, Masayuki Kurotaki, Junji Kido, Accepted May 28, 2003, Journal of Polymer Science: Part B: Polymer Physics, vol. 41. 2681-2690 (2003).*

\* cited by examiner

*Primary Examiner*—Matthew Smith
*Assistant Examiner*—Jae Lee
(74) *Attorney, Agent, or Firm*—Birch, Stewart, Kolasch & Birch, LLP

(57) ABSTRACT

An organic electroluminescent device, which has:
  at least one organic layer between a pair of electrodes, with at least one layer of the at least one organic layer being a light-emitting layer, and
  at least one compound that has a structure represented by formula (2), as the compound itself or as its partial structure, in at least one layer of the at least one organic layer:

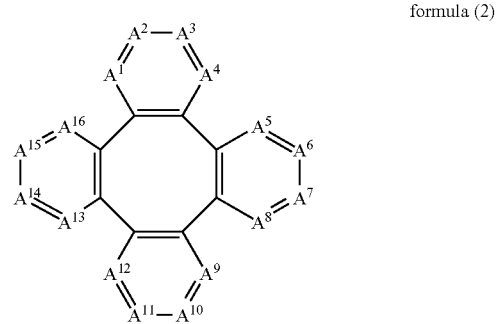

formula (2)

wherein, in formula (2), each of $A^1, A^2, A^3, A^4, A^5, A^6, A^7, A^8, A^9, A^{10}, A^{11}, A^{12}, A^{13}, A^{14}, A^{15}$, and $A^{16}$ represents a nitrogen atom or a carbon atom that may optionally have a substituent, and at least one of $A^1, A^2, A^3, A^4, A^5, A^6, A^7, A^8, A^9, A^{10}, A^{11}, A^{12}, A^{13}, A^{14}, A^{15}$ and $A^{16}$ is a nitrogen atom.

15 Claims, No Drawings

ORGANIC ELECTROLUMINESCENT DEVICE

FIELD OF THE INVENTION

The present invention relates to an organic electroluminescent device capable of emitting light by converting electric energy to light.

BACKGROUND OF THE INVENTION

Currently, research and development efforts have been actively made for various display devices, and of these, an organic electroluminescence (EL) device draws attention since it can emit high-intensity light at low voltage. Recently, there has been demand for improvement in device durability, and the electroluminescent device is also required to be improved in durability.

As suitable materials for improving durability of such devices, various aromatic condensed-ring hydrocarbon materials have been proposed. For example, JP-A-8-12600 ("JP-A" means unexamined published Japanese patent application) and JP-A-2001-335516 disclose diphenyl anthracene derivatives.

Since, however, the above aromatic condensed-ring materials generally have a low $T_1$ energy level, they are disadvantageous in efficiency of energy transfer to a dopant. To improve the light emission efficiency, it is desired to develop aromatic hydrocarbon materials having higher $T_1$ energy levels.

SUMMARY OF THE INVENTION

The present invention resides in an organic electroluminescent device, which has:
at least one organic layer between a pair of electrodes, with
  at least one layer of the at least one organic layer being a light-emitting layer, and
at least one compound selected from (a) a compound having a structure represented by formula (2) and (b) a compound having, as its partial structure, a group corresponding to (a), in at least one layer of the at least one organic layer:

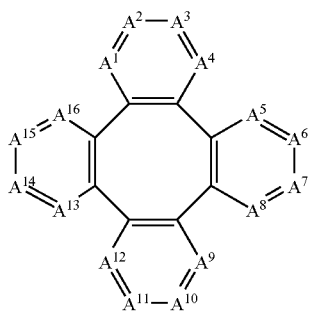

formula (2)

wherein, in formula (2), each of $A^1, A^2, A^3, A^4, A^5, A^6, A^7, A_8, A^9, A^{10}, A^{11}, A^{12}, A^{13}, A^{14}, A^{15}$, and $A^{16}$ represents a nitrogen atom or a carbon atom that may optionally have a substituent, and at least one of $A^1, A^2, A^3, A^4, A^5, A^6, A^7, A^8, A^9, A^{10}, A^{11}, A^{12}, A^{13}, A^{14}, A^{15}$, and $A^{16}$ is a nitrogen atom.

Further, the present invention resides in a display comprising the aforementioned organic electroluminescent device.

Other and further features and advantages of the invention will appear more fully from the following description.

DETAILED DESCRIPTION OF THE INVENTION (1) An organic electroluminescent device, which has:
at least one organic layer between a pair of electrodes, with
  at least one layer of the at least one organic layer being a light-emitting layer, and
at least one compound having a structure represented by formula (2), as the compound itself or as its partial structure, in at least one layer of the at least one organic layer:

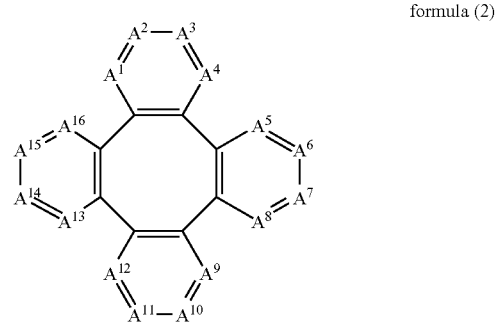

formula (2)

wherein, in formula (2), each of $A^1, A^2, A^3, A^4, A^5, A^6, A^7, A^8, A^9, A^{10}, A^{11}, A^{12}, A^{13}, A^{14}, A^{15}$, and $A^{16}$ represents a nitrogen atom or a carbon atom that may optionally have a substituent, and at least one of $A^1, A^2, A^3, A^4, A^5, A^6, A^7, A^8, A^9, A^{10}, A^{11}, A^{12}, A^{13}, A^{14}, A^{15}$, and $A^{16}$ is a nitrogen atom.

(2) The organic electroluminescent device as described in (1), wherein the compound having a structure represented by formula (2) as the compound itself has only one tetraphenylene structure.

(3) The organic electroluminescent device as described in (1), wherein the compound having a structure represented by formula (2) as its partial structure is a compound selected from a bonded compound, an oligomer compound, and a polymer compound, in each of which a plurality of compounds having a structure represented by formula (2) as the compound itself bond together.

(4) The organic electroluminescent device as described in any one of (1) to (3), wherein, in a tetraphenylene structure of the compound having a structure represented by formula (2), as the compound itself or as its partial structure, the number of nitrogen atom(s) that one six-membered ring has is 2 or less.

(5) The organic electroluminescent device as described in any one of (1) to (4), wherein, of six-membered rings forming the tetraphenylene structure of the compound having a structure represented by formula (2), as the compound itself or as its partial structure, a six-membered ring having a nitrogen atom has no substituent.

(6) The organic electroluminescent device as described in any one of (1) to (5), containing a phosphorescent material and at least one compound having a structure represented by formula (2), as the compound itself or as its partial structure.

(7) A display comprising the organic electroluminescent device described in any one of (1) to (6).

To overcome the above technical problems, the present inventors have made diligent studies and found that specific tetraphenylene derivatives have a high $T_1$ energy level. It has been found that, when they are used in a triplet light-emitting device, there can be obtained a device having high light emission efficiency and excellent driving durability. In addition, it has been further found that, when a light-emitting layer of the above light-emitting device further contains a compound that functions to inject and transport electrons, the light-emitting device is further improved in durability. The present invention will be explained in detail hereinafter.

Herein, the expression "a compound having a structure represented by formula (2), as the compound itself or as its partial structure" means a compound having a structure represented by formula (2) as the compound itself (hereinafter also referred to as "a compound having a structure represented by formula (2)") and/or a compound having a structure represented by formula (2) as its partial structure (hereinafter also referred to as "a compound having, as its partial structure, a group corresponding to the compound represented by formula (2)"). Hereinafter, the expression "a compound represented by formula (2)" or "a compound of formula (2)" means both a compound having a structure represented by formula (2) and a compound having, as its partial structure, a group corresponding to the compound represented by formula (2), unless otherwise specified.

The organic electroluminescent device of the present invention is an organic electroluminescent device having: at least one organic layer between a pair of electrodes, with the at least one organic layer including a light-emitting layer; and at least one compound represented by the following formula (2), in at least one layer of the at least one organic layer.

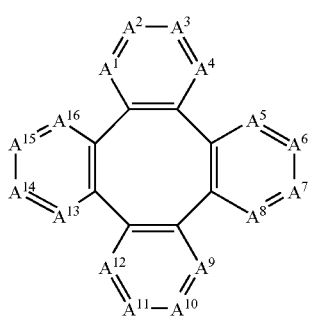

formula (2)

The formula (2) will be explained below. In the formula (2), each of $A^1, A^2, A^3, A^4, A^5, A^6, A^7, A^8, A^9, A^{10}, A^{11}, A^{12}, A^{13}, A^{14}, A^{15}$, and $A^{16}$ represents a nitrogen atom or a carbon atom that may optionally have a substituent, and at least one of $A^1, A^2, A^3, A^4, A^5, A^6, A^7, A^8, A^9, A^{10}, A^{11}, A^{12}, A^{13}, A^{14}, A^{15}$, and $A^{16}$ is a nitrogen atom.

Examples of the above substituent preferably include a halogen atom (e.g. a fluorine atom, a chlorine atom, a bromine atom, and an iodine atom), an alkyl group (preferably, an alkyl group having 1 to 30 carbon atoms, e.g. methyl, ethyl, n-propyl, isopropyl, t-butyl, n-octyl, and 2-ethylhexyl), a cycloalkyl group (preferably, a substituted or unsubstituted cycloalkyl group having 3 to 30 carbon atoms, e.g. cyclohexyl, cyclopentyl, and 4-n-dodecylcyclohexyl), a bicycloalkyl group (preferably, a substituted or unsubstituted bicycloalkyl group having 5 to 30 carbon atoms, that is, a monovalent group obtained by removing one hydrogen atom from a bicycloalkane having 5 to 30 carbon atoms, e.g. bicyclo[1,2,2]heptane-2-yl and bicyclo[2,2,2]octane-3-yl), an alkenyl group (preferably, a substituted or unsubstituted alkenyl group having 2 to 30 carbon atoms, e.g. vinyl and allyl), a cycloalkenyl group (preferably, a substituted or unsubstituted cycloalkenyl group having 3 to 30 carbon atoms, that is, a monovalent group obtained by removing one hydrogen atom from a cycloalkene having 3 to 30 carbon atoms, e.g. 2-cyclopentene-1-yl and 2-cyclohexene-1-yl), a bicycloalkenyl group (a substituted or unsubstituted bicycloalkenyl group, preferably, a substituted or unsubstituted bicycloalkenyl group having 5 to 30 carbon atoms, that is, a monovalent group obtained by removing one hydrogen atom from a bicycloalkene having one double bond; e.g. bicyclo[2,2,1]hept-2-ene-1-yl and bicyclo[2,2,2]oct-2-ene-4-yl), an alkynyl group (preferably, a substituted or unsubstituted alkynyl group having 2 to 30 carbon atoms, e.g. ethynyl and propargyl), an aryl group (preferably a substituted or unsubstituted aryl group having 6 to 30 carbon atoms, e.g. phenyl, p-tolyl, and naphthyl), a heterocyclic group (preferably, a monovalent group obtained by removing one hydrogen atom from a 5- or 6-membered, substituted or unsubstituted, aromatic or non-aromatic heterocyclic compound, more preferably a 5- or 6-membered aromatic heterocyclic group having 3 to 30 carbon atoms, e.g. 2-furyl, 2-thienyl, 2-pyrimidinyl, and 2-benzothiazolyl), a cyano group, a hydroxyl group, a nitro group, a carboxyl group, an alkoxy group (preferably, a substituted or unsubstituted alkoxy group having 1 to 30 carbon atoms, e.g. methoxy, ethoxy, isopropoxy, t-butoxy, n-octyloxy, and 2-methoxyethoxy), an aryloxy group (preferably, a substituted or unsubstituted aryloxy group having 6 to 30 carbon atoms, e.g. phenoxy, 2-methylphenoxy, 4-t-butylphenoxy, 3-nitrophenoxy, and 2-tetradecanoylaminophenoxy), a silyloxy group (preferably, a silyloxy group having 3 to 20 carbon atoms, e.g. trimethylsilyloxy and t-butyldimethylsilyloxy), a heterocyclic oxy group (preferably, a substituted or unsubstituted heterocyclic oxy group having 2 to 30 carbon atoms, e.g. 1-phenyltetrasol-5-oxy, and 2-tetrahydropyranyloxy), an acyloxy group (preferably, a formyloxy group, a substituted or unsubstituted alkylcarbonyloxy group having 2 to 30 carbon atoms, and a substituted or unsubstituted arylcarbonyloxy group having 6 to 30 carbon atoms, e.g. formyloxy, acetyloxy, pivaloyloxy, stearoyloxy, benzoyloxy, and p-methoxyphenylcarbonyloxy), a carbamoyloxy group (preferably, a substituted or unsubstituted carbamoyloxy group having 1 to 30 carbon atoms, e.g. N,N-dimethylcarbamoyloxy, N,N-diethylcarbamoyloxy, morpholinocarbonyloxy, N,N-di-n-octylaminocarbonyloxy, and N-n-octylcarbamoyloxy), an alkoxycarbonyloxy group (preferably, a substituted or unsubstituted alkoxycarbonyloxy group having 2 to 30 carbon atoms, e.g. methoxycarbonyloxy, ethoxycarbonyloxy, t-butoxycarbonyloxy, and n-octylcarbonyloxy), an aryloxycarbonyloxy group (preferably, a substituted or unsubstituted aryloxycarbonyloxy group having 7 to 30 carbon atoms, e.g. phenoxycarbonyloxy, p-methoxyphenoxycarbonyloxy, and p-n-hexadecyloxyphenoxycarbonyloxy), an amino group (preferably, an amino group, a substituted or unsubstituted alkylamino group having 1 to 30 carbon atoms, and a substituted or unsubstituted anilino group having 6 to 30 carbon atoms, e.g. amino, methylamino, dimethylamino, anilino, N-methyl-anilino, and diphenylamino), an acylamino group (preferably, a formylamino group, a substituted or unsubstituted alkylcarbonylamino group having 1 to 30 carbon atoms, and a substituted or unsubstituted arylcarbonylamino group having 6 to 30 carbon atoms, e.g. formylamino, acetylamino, pivaloylamino, lauroylamino, and benzoylamino), an aminocarbonylamino group (preferably, a substituted or unsubstituted aminocarbonylamino group having 1 to 30 carbon atoms, e.g. carbamoylamino, N,N-dimethylaminocarbonylamino, N,N-diethylaminocarbonylamino, and morpholinocarbonylamino), an alkoxycarbonylamino group (preferably, a substituted or unsubstituted alkoxycarbonylamino group having 2 to 30 carbon atoms, e.g. methoxycarbonylamino, ethoxycarbonylamino, t-butoxycarbonylamino, n-octadecyloxycarbonylamino, and N-methyl-methoxycarbonylamino), an aryloxycarbonylamino group (preferably, a substituted or unsubstituted aryloxycarbonylamino group having 7 to 30 carbon atoms, e.g. phenoxycarbonylamino, p-chlorophenoxycarbonylamino, and m-n-octyloxyphenoxycarbonylamino), a sulfamoylamino group (preferably, a substituted or unsubstituted sulfamoylamino group having 0 to 30 carbon atoms, e.g. sulfamoylamino, N,N-dimethylaminosulfonylamino, and N-n-octylaminosulfonylamino), an alkyl- or aryl-sulfonylamino group (preferably, a substituted or unsubstituted alkylsulfonylamino group having 1 to 30 carbon atoms and a substituted or unsubstituted arylsulfonylamino group having 6 to 30 carbon atoms, e.g. methylsulfonylamino, butylsulfonylamino, phenylsulfonylamino, 2,3,5-trichlorophenylsulfonylamino, and p-methylphenylsulfonylamino), a mercapto group, an alkylthio group (preferably, a substituted or unsubstituted alkylthio group having 1 to 30 carbon atoms, e.g. methylthio, ethylthio, and n-hexadecylthio), an arylthio group (preferably, a substituted or unsubstituted arylthio group having 6 to 30 carbon atoms, e.g. phenylthio, p-chlorophenylthio, and m-methoxyphenylthio), a heterocyclic thio group (preferably, a substituted or unsubstituted heterocyclic thio group having 2 to 30 carbon atoms, e.g. 2-benzothiazolylthio, and 1-phenyltetrazol-5-yl thio), a sulfamoyl group (preferably, a substituted or unsubstituted sulfamoyl group having 0 to 30 carbon atoms, e.g. N-ethylsulfamoyl, N-(3-dodecyloxypropyl)sulfamoyl, N,N-dimethylsulfamoyl, N-acetylsulfamoyl, N-benzoylsulfamoyl, and N-(N'-phenylcarbamoyl)sulfamoyl), a sulfo group, an alkyl- or aryl-sulfinyl group (preferably a substituted or unsubstituted alkylsulfinyl group having 1 to 30 carbon atoms and a substituted or unsubstituted arylsulfinyl group having 6 to 30 carbon atoms, e.g. methylsulfinyl, ethylsulfinyl, phenylsulfinyl, and p-methylphenylsulfinyl), an alkyl- or aryl-sulfonyl group (preferably, a substituted or unsubstituted alkylsulfonyl group having 1 to 30 carbon atoms and a substituted or unsubstituted arylsulfonyl group having 6 to 30 carbon atoms, e.g. methylsulfonyl, ethylsulfonyl, phenylsulfonyl, and p-methylphenylsulfonyl), an acyl group (preferably, a formyl group, a substituted or unsubstituted alkylcarbonyl group having 2 to 30 carbon atoms and a substituted or unsubstituted arylcarbonyl group having 7 to 30 carbon atoms, e.g. acetyl and pivaloylbenzoyl), an aryloxycarbonyl group (preferably, a substituted or unsubstituted aryloxycarbonyl group having 7 to 30 carbon atoms, e.g. phenoxycarbonyl, o-chlorophenoxycarbonyl, m-nitrophenoxycarbonyl, and p-t-butylphenoxycarbonyl), an alkoxycarbonyl group (preferably, a substituted or unsubstituted alkoxycarbonyl group having 2 to 30 carbon atoms, e.g. methoxycarbonyl, ethoxycarbonyl, t-butoxycarbonyl, and n-octadecyloxycarbonyl), a carbamoyl group (preferably a substituted or unsubstituted carbamoyl group having 1 to 30 carbon atoms, e.g. carbamoyl, N-methylcarbamoyl, N,N-dimethylcarbamoyl, N,N-di-n-octylcarbamoyl, and N-(methylsulfonyl)carbamoyl), an aryl- or heterocyclic-azo group (preferably, a substituted or unsubstituted arylazo group having 6 to 30 carbon atoms and a substituted or unsubstituted heterocyclic azo group having 3 to 30 carbon atoms, e.g. phenylazo, p-chlorophenylazo, and 5-ethylthio-1,3,4-thiadiazol-2-yl azo), an imido group (preferably, N-succinimido, and N-phthalimido), a phosphino group (preferably, a substituted or unsubstituted phosphino group having 2 to 30 carbon atoms, e.g. dimethylphosphino, diphenylphosphino, and methylphenoxyphosphino), a phosphinyl group (preferably, a substituted or unsubstituted phosphinyl group having 2 to 30 carbon atoms, e.g. phosphinyl, dioctyloxyphosplinyl, and diethoxyphosphinyl), a phosphinyloxy group (preferably, a substituted or unsubstituted phosphinyloxy group having 2 to 30 carbon atoms, e.g. diphenoxyphosphinyloxy, and dioctyloxyphosphinyloxy), a phosphinylamino group (preferably, a substituted or unsubstituted phosphinylamino group having 2 to 30 carbon atoms, e.g. dimethoxyphosphinylamino, and dimethylaminophosphinylamino), and a silyl group (preferably, a substituted or unsubstituted silyl group having 3 to 30 carbon atoms, e.g. trimethylsilyl, t-butyldimethylsilyl, and phenyldimethylsilyl).

Of the above substituents, those substituents which have hydrogen atom(s) may be further substituted with the above groups in place of the hydrogen atom(s). Examples of such functional groups include an alkylcarbonylaminosulfonyl group, an arylcarbonylaminosulfonyl group, an alkylsulfonylaminocarbonyl group, and an arylsulfonylaminocarbonyl group. Examples thereof include methylsulfonylaminocarbonyl, p-methylphenylsulfonylaminocarbonyl, acetylaminosulfonyl, and benzoylaminosulfonyl. The substituents may be condensed to form a condensed ring.

Examples of the preferred substituent includes an alkyl group having 1 to 3 carbon atoms (e.g. methyl, ethyl, and isopropyl), a halogen atom (e.g. a chlorine atom and a fluorine atom), a substituted or unsubstituted aryl group having 6 to 12 carbon atoms (e.g. phenyl and naphthyl), and a substituted or unsubstituted heterocyclic group having 1 to 10 carbon atoms (e.g. pyridyl and imidazolyl), and also preferred is the case wherein a condensed ring is formed by condensation of substituents.

In the compound represented by formula (2), among the divalent six-membered ring groups forming the tetraphenylene structure, the six-membered ring(s) having nitrogen atom preferably has no substituent, except for the case of forming a condensed ring together with substituents. Further, in the tetraphenylene structure of the compound represented by formula (2), the number of nitrogen atoms that one divalent six-membered ring group has is preferably 3 or less, more preferably 2 or less.

In the formula (2), at least one of $A^1$ to $A^{16}$ is a nitrogen atom, and, particularly preferably, at least one atom selected from $A^1$, $A^4$, $A^5$, $A^8$, $A^9$, $A^{12}$, $A^{13}$, and $A^{16}$ is a nitrogen atom. Further, two or more atoms of $A^1$ to $A^{16}$ are still more preferably nitrogen atoms.

Further, also preferred is the case where a divalent six-membered ring group forms a pyrimidine ring or a pyrazine ring, and more preferred is the case where a six-membered ring group forms a pyrazine ring.

The compound represented by formula (2) preferably has one tetraphenylene structure. In the present invention, the term "tetraphenylene structure" refers to a structure in which divalent six-membered ring groups are condensed on four sides, as shown in formula (2), and it does not mean that the condensed ring is limited to a phenylene group. Therefore, any of the atoms constituting the six-membered ring may be, for example, a nitrogen atom other than a carbon atom. The expression "has one tetraphenylene structure" means that the compound represented by formula (2) has no substituent having a tetraphenylene structure, besides the tetraphenylene structure constituting the basic structure of the compound represented by formula (2). However, this limitation does not apply to the case that a compound represented by formula (2) is a bonded compound (multimer), an oligomer compound, a polymer compound, etc., which will be explained below.

The compound of the formula (2) may be a single compound. Alternatively, the compound of the formula (2) may be, for example, a compound in which compounds including a compound having a structure represented by formula (2) are bonded through a linking group, or a compound in which compounds including a compound having a structure represented by formula (2) are bonded by dissociation of an atom such as a hydrogen atom or the like. For example, the compound of the formula (2) may be a multimer such as a dimer or a higher multimer, in which two or more compounds of the formula (2) are bonded. The compound of the formula (2) may be any one of a low-molecular-mass compound, an oligomer compound, or a polymer compound (the mass average molecular mass thereof (converted to a polystyrene) is preferably 1,000 to 5,000,000, more preferably 2,000 to 1,000,000, and still more preferably 3,000 to 100,000). When a polymer compound is formed, the compound represented by formula (2) may be contained in the main chain of the polymer, or may be contained in a side chain thereof. Further, in the case of the polymer compound, the polymer compound may be a homopolymer compound or a copolymer. The compound represented by formula (2) for use in the organic electroluminescent device of the present invention is preferably a low-molecular-mass compound.

The $T_1$ level (energy level in a lowest triplet excitation state) of the compound represented by formula (2) is preferably at least 45 kcal/mol (at least 188.3 kJ/mol), more preferably at least 55 kcal/mol (at least 251.0 kJ/mol) but not more than 85 kcal/mol (not more than 355.6 kJ/mol), still more preferably at least 60 kcal/mol (at least 272.0 kJ/mol) but not more than 85 kcal/mol (not more than 355.6 kJ/mol).

While examples of the compound of the formula (2) for use in the organic electroluminescent device of the present invention will be shown below, the present invention shall not be limited thereto.

(2-1)

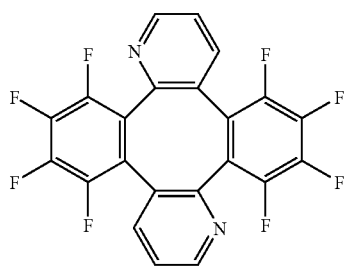

(2-2)

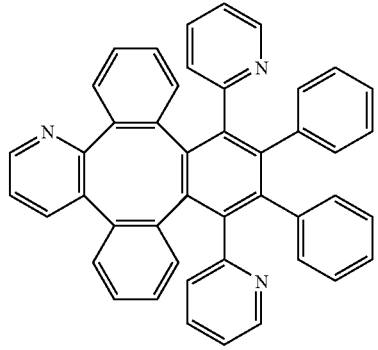

(2-3)

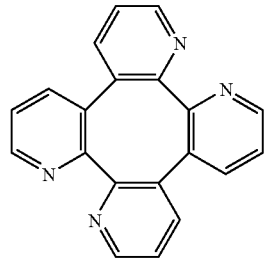

(2-4)

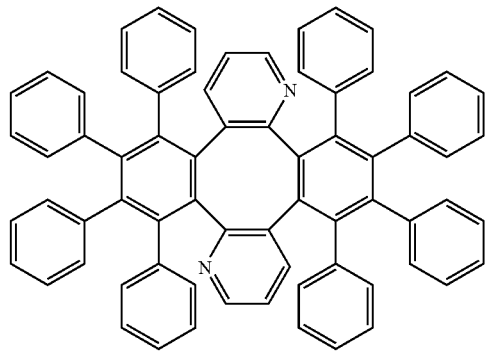

(2-5)

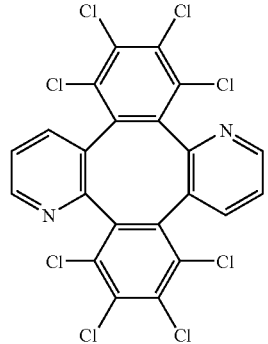

(2-6)

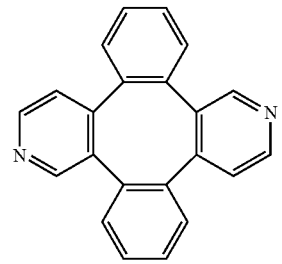

-continued
(2-7)
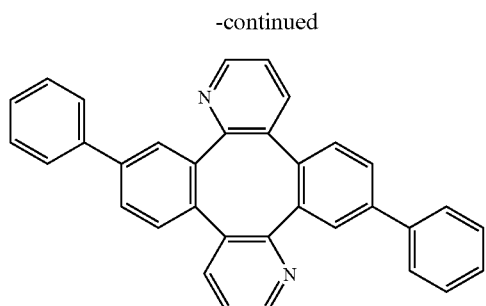
(2-8)
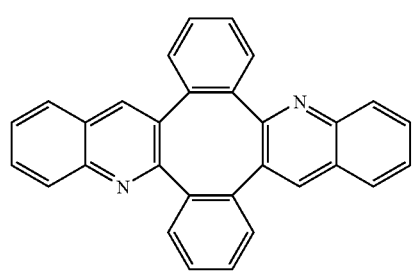
(2-9)
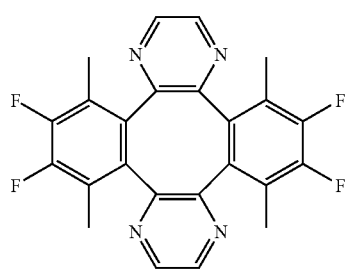
(2-10)
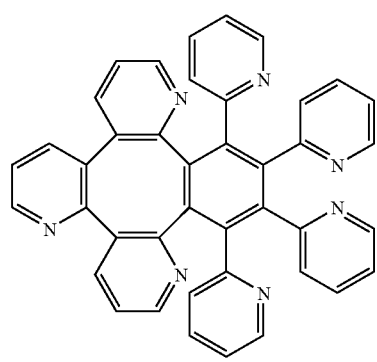
(2-11)
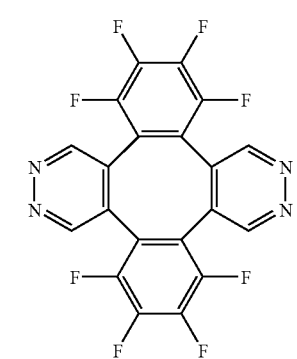
-continued
(2-12)
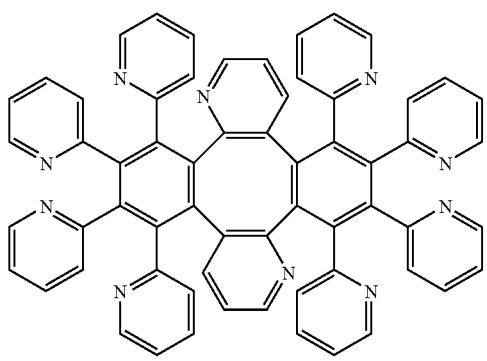
(2-13)
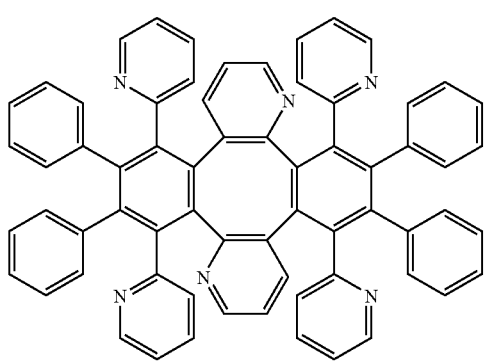
(2-14)
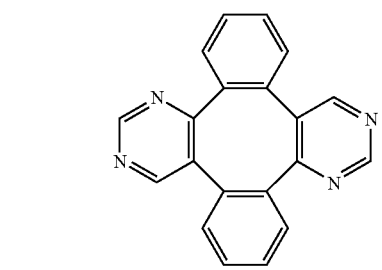
(2-15)
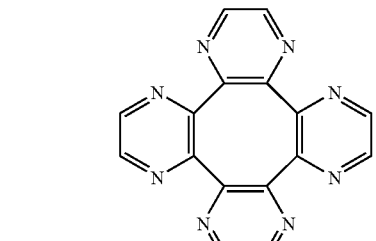
(2-16)
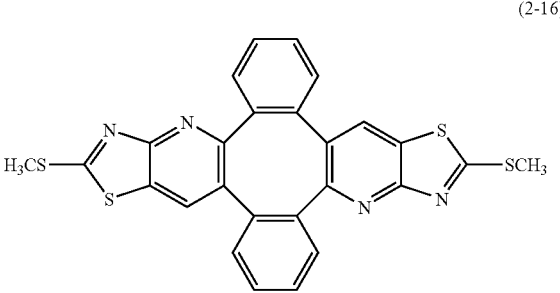

(2-17)
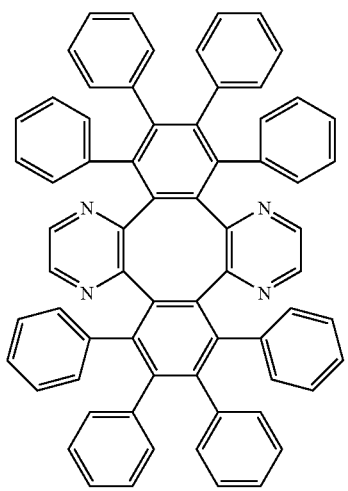
(2-18)
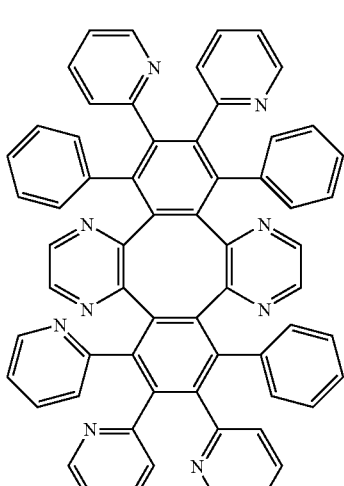
(2-19)
(2-20)
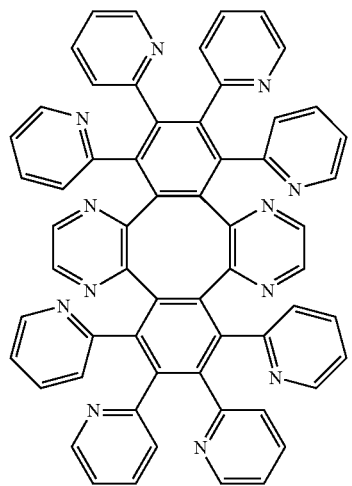
(2-21)
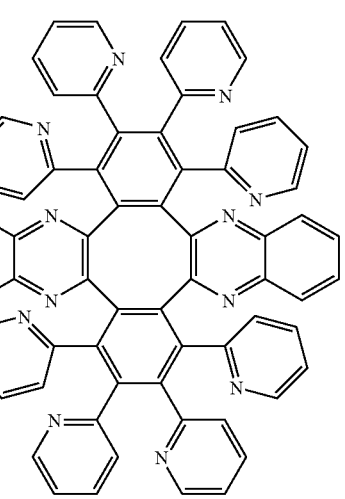
(2-22)
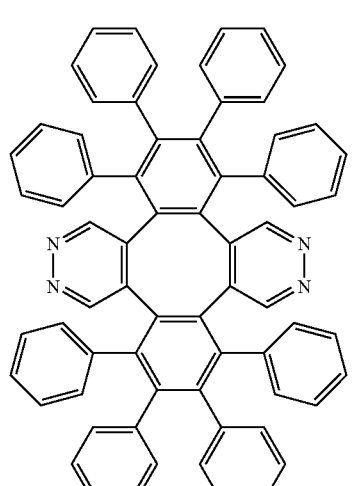

-continued
(2-23)
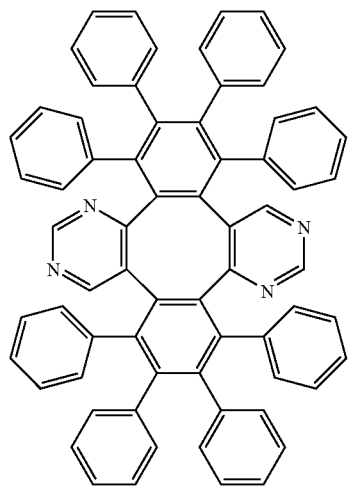
(2-24)
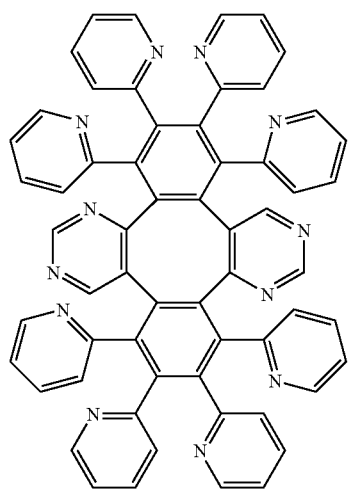
(2-25)
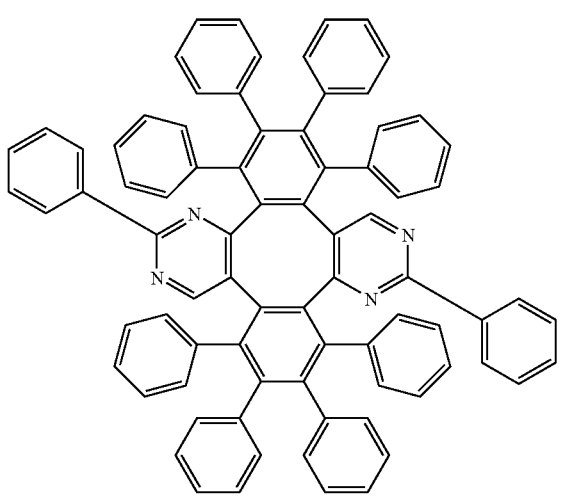
(2-26)
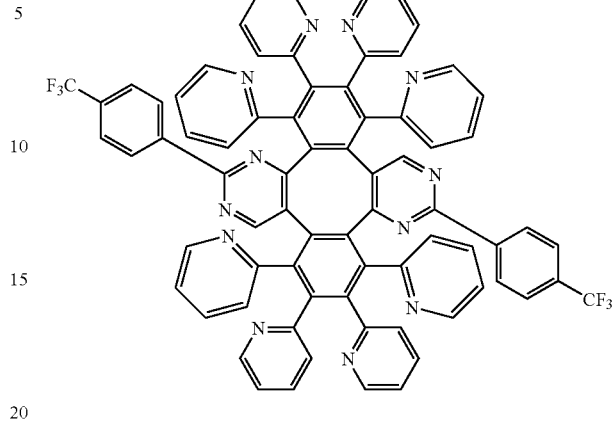
(2-27)
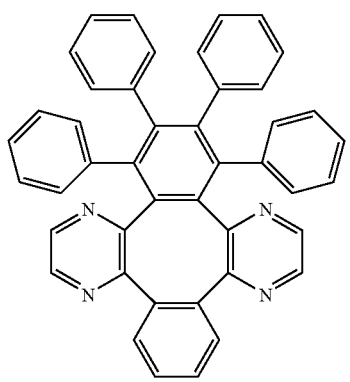
(2-28)
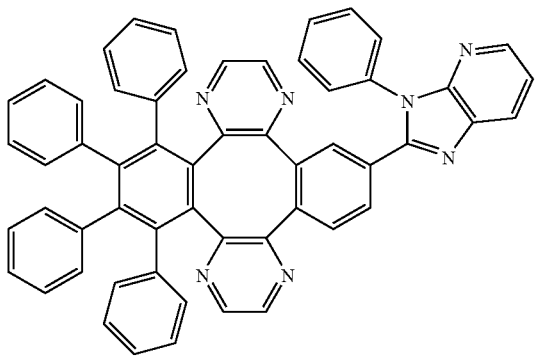
(2-29)
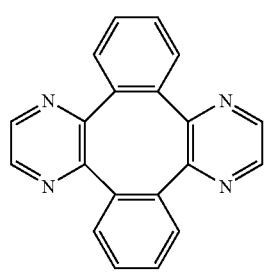

-continued
(2-30)
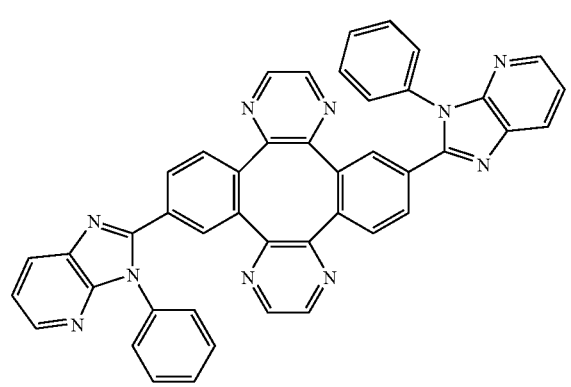
(2-34)
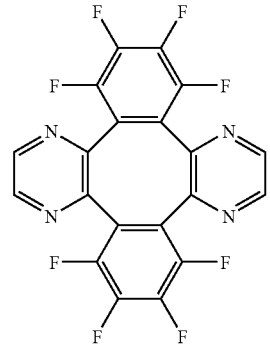
(2-31)
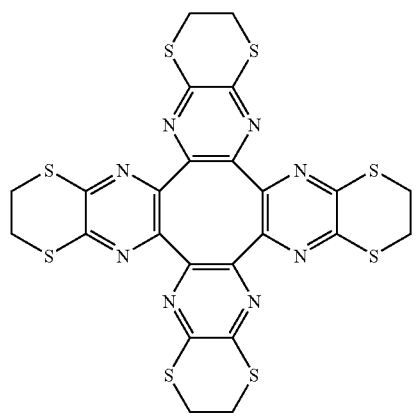
(2-35)
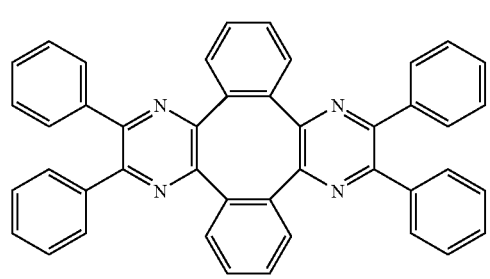
(2-32)
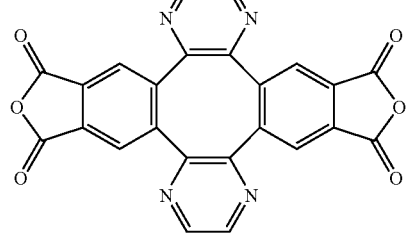
(2-36)
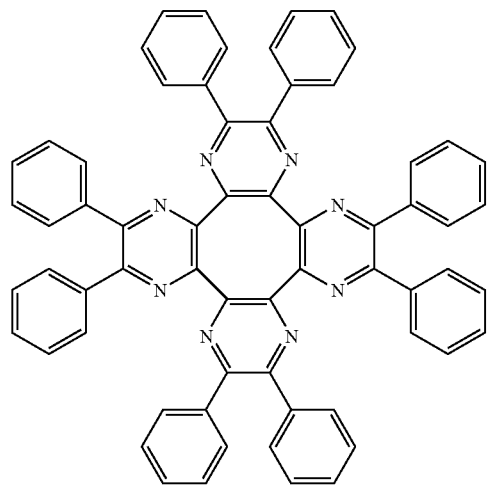
(2-33)
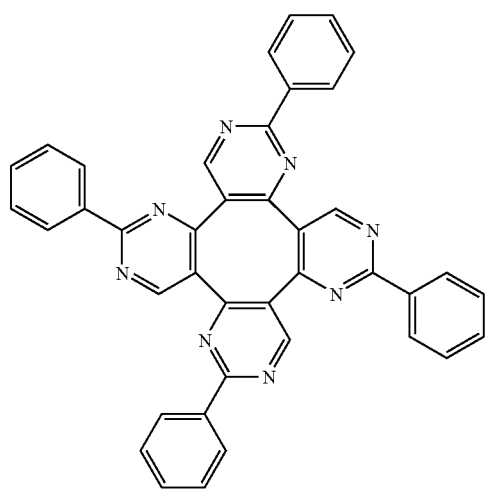
(2-37)
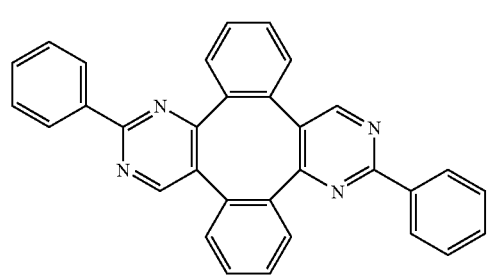

-continued
(2-38)
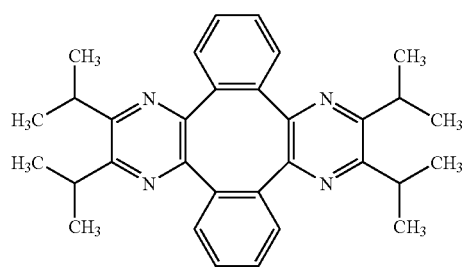
(2-39)
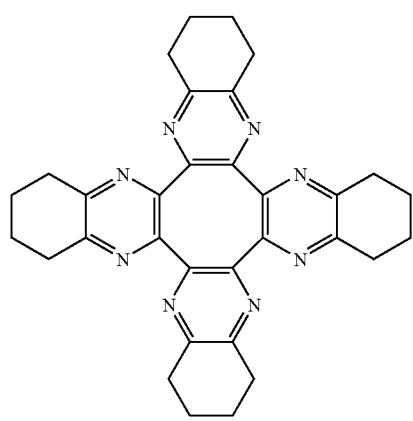
(2-40)
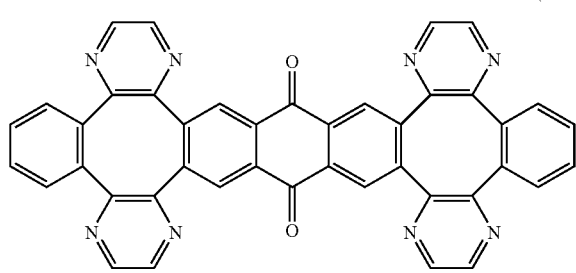
(2-41)
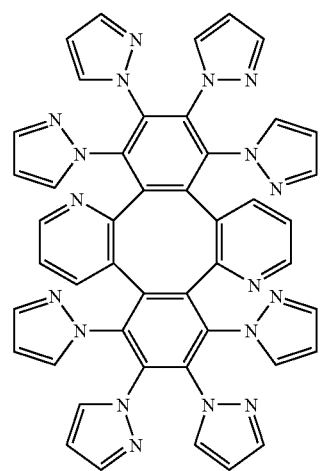
-continued
(2-42)
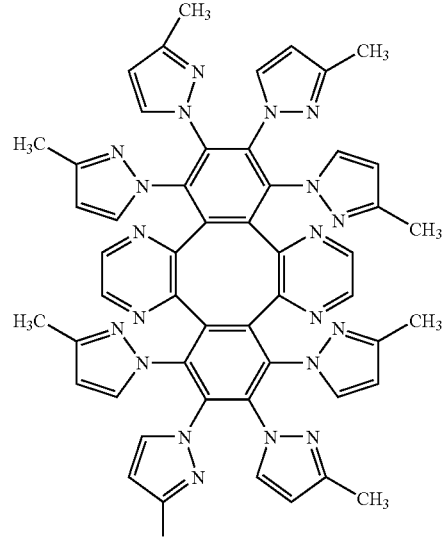
(2-43)
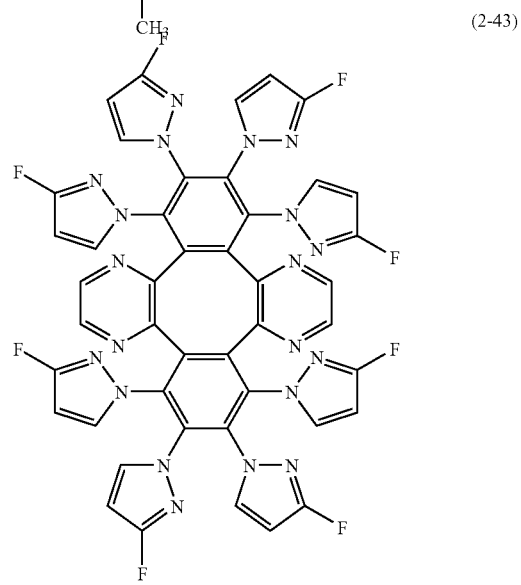
(2-44)
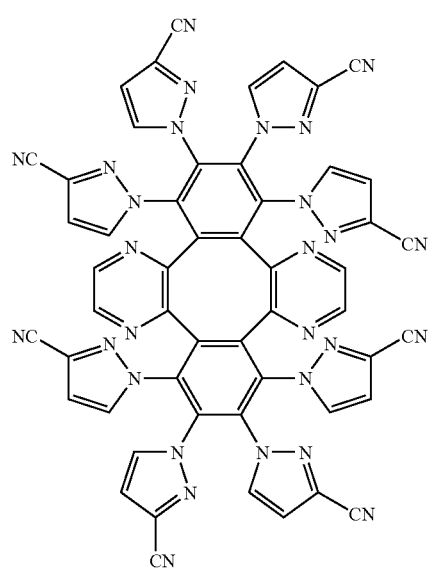

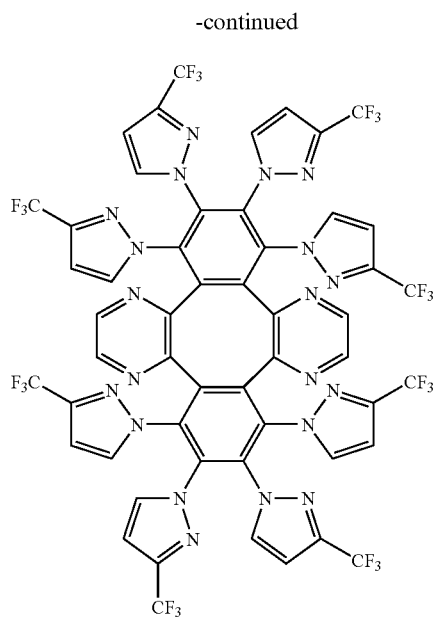
(2-45)
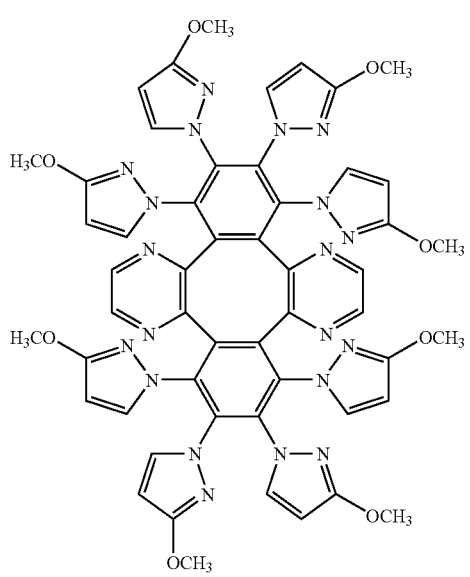
(2-46)
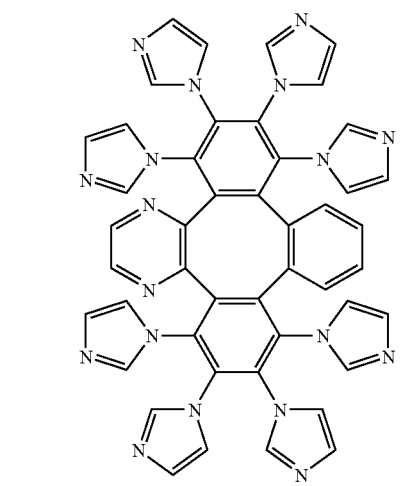
(2-47)
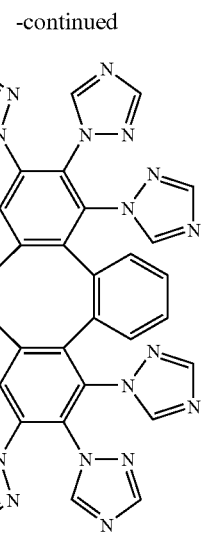
(2-48)
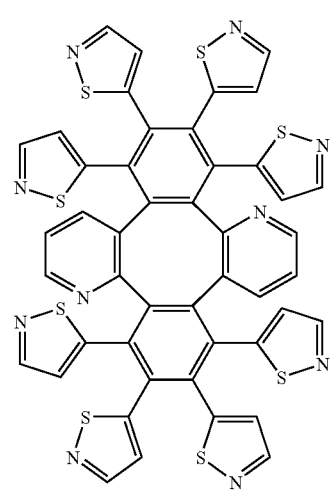
(2-49)
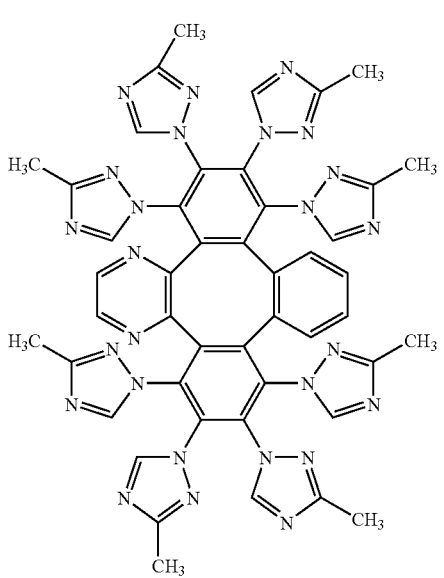
(2-50)

-continued
(2-51)
(2-52)
(2-53)
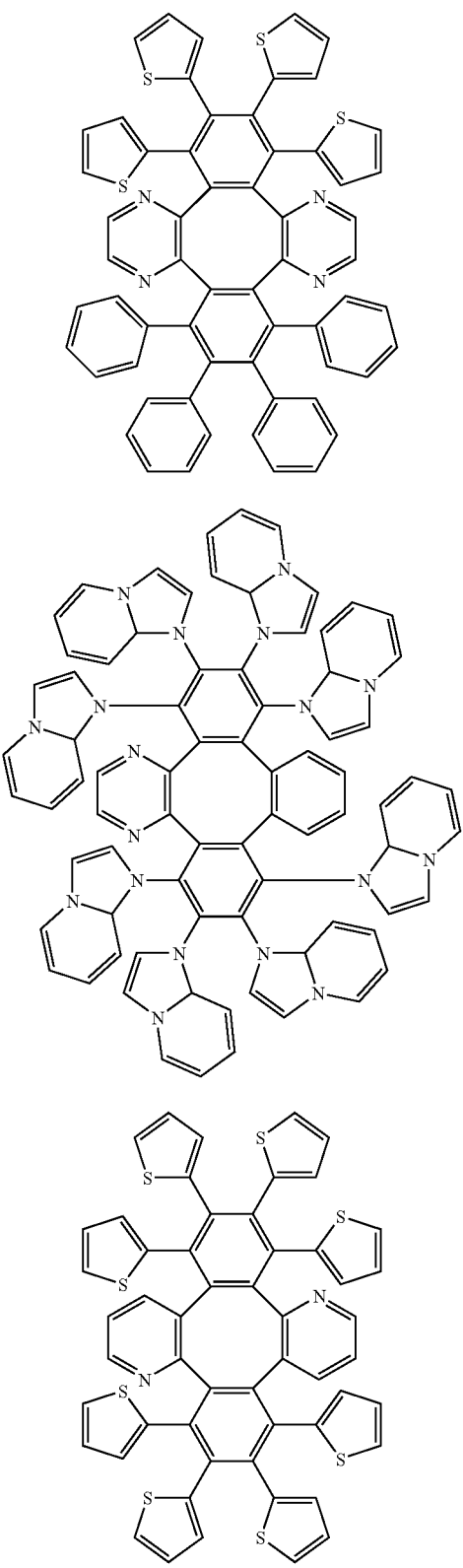
-continued
(2-54)
(2-55)
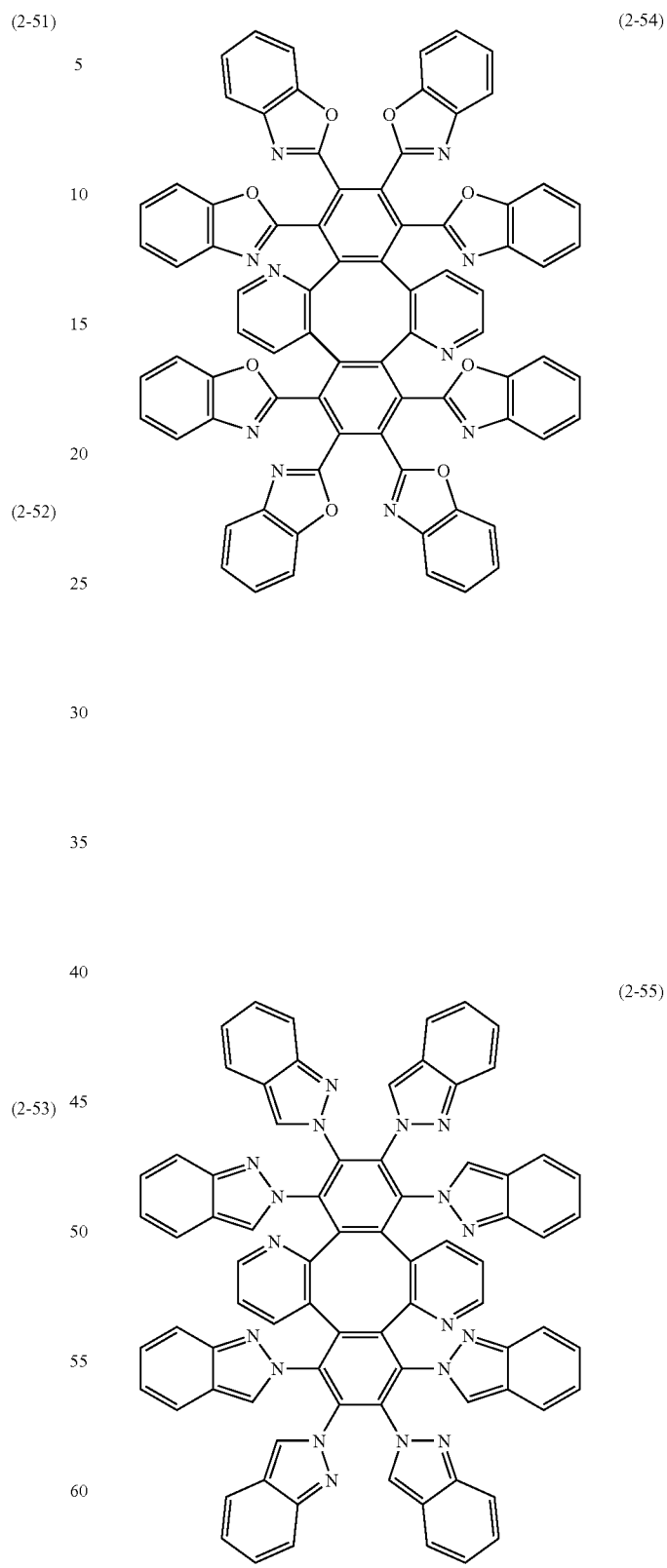

-continued (2-56)

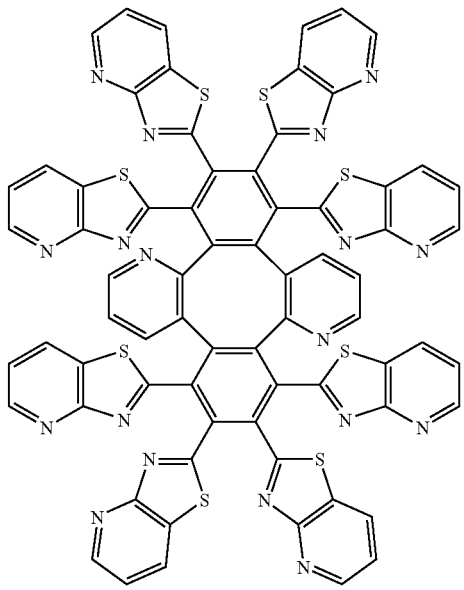

The compound represented by formula (2) for use in the organic electroluminescent device of the present invention can be synthesized, for example, by a method described in Justus Liebigs Annalen der Chemie, 751, 1 (1971), Tetrahedron Letters, 39, 5393 (1998), Journal of Organomet. Chem. 10, 471 (1967), Angewandte Chemie, International Edition in English, 87, 746 (1975), or the like.

Specifically, the compound of the formula (2) can be synthesized according to various generally used aromatic carbon-carbon bonding generation reactions or carbon-nitrogen bonding generation reaction. For example, it can be synthesized by a reaction between a halogen compound having a tetraphenylene structure and a boric acid derivative, or a reaction between a halogen compound having a tetraphenylene structure and an aromatic amine compound in the presence of a palladium catalyst.

For example, the above mentioned compound (2-17) according to the present invention can be synthesized according to a scheme as shown below, with reference to the methods disclosed in Chemistry A European Journal 8(9), 2000-2004 (2002) and Angewante Chemie, the International Edition in English 36, 1607-1609 (1997), however the present invention is not limited to this method.

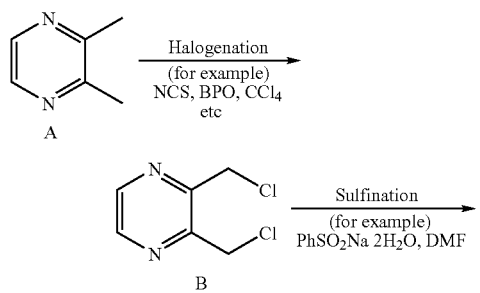

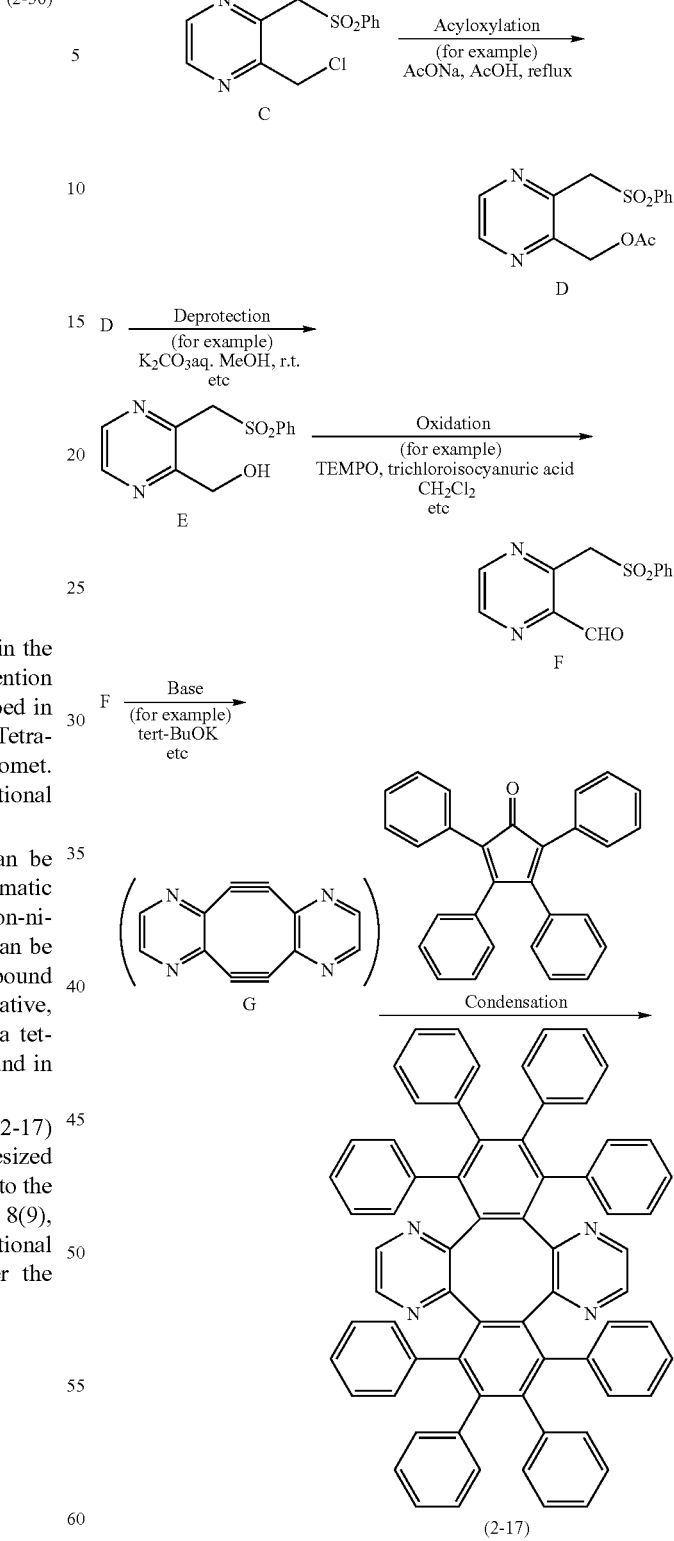

In the organic electroluminescent device of the present invention, light emission from any excitation state of the light-emitting material can be utilized. However, the organic electroluminescent device is preferably a device that utilizes light emission from a triplet excitation state. The above light emission from a triplet excitation state has the same meaning as phosphorescence emission (hereinafter a material that emits phosphorescent light will be referred to as "phosphorescent material" hereinafter). When the organic electroluminescent device of the present invention is comprised of a phosphorescent material, it is preferred to incorporate at least one phosphorescent material. In this case, the phosphorescent material for use in the present invention is not specially limited, while a transition metal complex is preferred. Of transition metal complexes, an orthometalated complex can be particularly preferably used. The orthometalated complex is a general term for a group of compounds described in "Yuki Kinzoku, Kiso To Oyo (Organometal Chemistry, Basics and Application)" by Akio YAMAMOTO, pages 150 and 232, Shokabo-sha (1982), "Photochemistry and Photophysics of Coordination Compounds", by H. Yersin, pages 71 to 77 and 135 to 146, Springer-Verlag (1987), and the like. While being not specially limited, the central metal of the transition metal complex is preferably iridium, platinum, rhenium, or ruthenium, more preferably iridium or platinum, and particularly preferably platinum. The transition metal complex is preferably a complex having a tridentate or higher polydentate ligand, and more preferably a complex having a tetradentate or higher polydentate ligand. Specific examples of such a complex are complexes represented by any of the formulas (1) to (18) described in WO 04/099339 and complexes represented by any of the formulas (1) to (12) described in WO 04/108857.

The above phosphorescent material preferably has a phosphorescence quantum yield, measured at 20° C., of at least 70%, more preferably has a phosphorescence quantum yield, measured at 20° C., of at least 80%, and particularly preferably has a phosphorescence quantum yield, measured at 20° C., of at least 85%.

Further, the present invention can be applied to every device that emits light in a wavelength region. Particularly, the device of the present invention has the phosphorescence λ max (maximum emission value) preferably in a wavelength region not more than 495 nm, which has been believed to be difficult to be accomplished. The phosphorescence λmax is preferably 480 m or less, more preferably 470 mm or less, further preferably 465 nm or less, and particularly preferably 460 nm or less.

Preferred embodiments of the compound represented by formula (2) will be explained further in detail below, and the following explanation also applies to the compound having, as its partial structure, a group corresponding to the compound represented by formula (2).

While the compound represented by formula (2) may be contained in any layer of the organic electroluminescent device of the present invention, it is preferably contained in an organic layer, and it is more preferably contained in an electron-transporting layer or a light-emitting layer. Further, one or a plurality of compounds represented by formula (2) may be contained in the organic electroluminescent device; and when a plurality of the compound represented by formula (2) is contained, they may be contained in the same layer or in a plurality of layers. Further, the compound represented by formula (2) may be contained in one organic layer of the organic electroluminescent device together with another light-emitting material or a phosphorescent material, or the compound and such a material may be contained separately in different organic layers.

While the system, driving method, utilization form, and the like, of the organic electroluminescent device of the present invention are not specially limited, it is preferred to employ a constitution in which the compound represented by formula (2) is used as a charge-transporting material and a constitution in which the compound represented by formula (2) and the phosphorescent material are used in the same layer. When the compound represented by formula (2) and the phosphorescent material are used in the same layer, the compound represented by formula (2) mainly functions as a host material. As a typical example of a light-emitting device, an organic EL (electroluminescence) device can be mentioned.

When the compound represented by formula (2) is contained in the light-emitting layer of the organic electroluminescent device of the present invention, the light-emitting layer may contain a compound b that functions for hole injection and/or transportation, together with the compound represented by the formula (2).

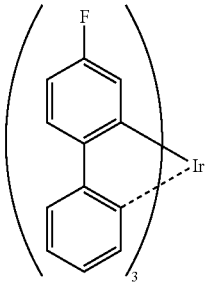

Compound b

The compound that is contained in the light-emitting layer and functions for hole injection and/or transportation means a compound that plays a role in hole injection and/or transportation in the light-emitting layer, and it is a compound that promotes the hole injection or transportation when added to the light-emitting layer, or it is a compound whose Ip value (ionization potential) is suitable for hole injection and/or transportation.

When the compound that functions for hole injection and/or transportation is contained in the light-emitting layer, the injection of holes into the light-emitting layer becomes easy, so that the driving voltage can be lowered. As a consequence, the decomposition of material caused by application of a high electric field can be suppressed. Further, since the compound b functions to transport holes, the decomposition of material caused by injection of holes into the compound represented by formula (2) can be suppressed.

When the light-emitting layer contains the compound b that functions for hole injection and/or transportation, together with the compound represented by the above formula (2), preferably, the concentration of the compound represented by formula (2) in the light-emitting layer is 10 to 99 mass %, and the concentration of the compound b that injects and/or transports holes in the light-emitting layer is 1 to 90 mass %. More preferably, the concentration of the compound represented by formula (2) is 15 to 98 mass %, and the concentration of the compound b that injects and/or transports holes is 2 to 85 mass %. Particularly preferably, the concentration of the compound represented by formula (2) is 20 to 95 mass %, and the concentration of the compound b that injects and/or transports holes is 5 to 80 mass %.

The organic electroluminescent device of the present invention has, between a pair of electrodes (cathode and anode), at least one organic layer (hereinafter also referred to as "organic compound layer") including a light-emitting layer (i.e. one aspect of the present invention is the case where the organic layer being a single light-emitting layer), and at least one of the above layers contains the compound represented by formula (2). The mass ratio of the compound represented by formula (2) in the layer containing the compound represented by formula (2) is preferably 50 to 99.9 mass %, more preferably 60 to 99 mass % when the compound represented by formula (2) is used as a host material. When the compound represented by formula (2) is used as a charge-transporting material, the mass ratio is preferably 50 to 100 mass %, more preferably 60 to 100 mass %.

The method for forming the layer containing the compound represented by formula (2) is not particularly limited, and the method can be selected from a resistance heating vapor deposition method, an electron beam method, a sputtering method, a molecular lamination method, a coating method, an inkjet method, a printing method, or the like. Of these, a resistance heating vapor deposition method, a coating method, and a transfer method are preferred in view of properties and production of the device.

The organic electroluminescent device of the present invention may have a hole-injecting layer, a hole-transporting layer, an electron-injecting layer, an electron-transporting layer, a protective layer, and the like, in addition to the light-emitting layer, and these layers may each have other function(s). The compound represented by formula (2) for use in the organic electroluminescent device of the present invention may be contained in any one of these layers.

In the organic electroluminescent device of the present invention, preferably, a layer that contains a compound having an ionization potential of 5.9 eV or more is provided between a cathode and the light-emitting layer. The above ionization potential is particularly preferably 6.0 eV or more, and such a layer is particularly preferably an electron-transporting layer.

In view of blue color purity, the light emission maximum wavelength of the organic electroluminescent device of the present invention is preferably 390 to 495 nm, more preferably 400 to 490 nm. Further, the organic electroluminescent device of the present invention may have a light emission maximum wavelength at 500 μm or longer, and it may be a white-light-emitting device. From the viewpoint of blue color purity, the x value of CIE chromaticity value of light emission is preferably 0.22 or less, more preferably 0.20 or less, and the y value of CIE chromaticity value of light emission is preferably 0.53 or less, more preferably 0.50 or less. From the viewpoint of blue color purity, further, the half-width of light emission spectrum is preferably 100 nm or less, more preferably 90 nm or less, still more preferably 80 nm or less, particularly preferably 70 nm or less.

Each layer of the organic electroluminescent device of the present invention will be explained in detail below.

(A) Anode

An anode is for supplying holes to the hole-injecting layer, the hole-transporting layer, the light-emitting layer, and the like. The material for forming the anode can be selected from a metal, an alloy, a metal oxide, an electrically conductive compound, a mixture of these, and the like; and preferably, it is a material having a work function of 4 eV or more. Specific examples of the above material include metals (e.g. gold, silver, chromium, nickel), electrically conductive metal oxides (e.g. tin oxide, zinc oxide, indium oxide, indium tin oxide (ITO)), mixtures or laminates of these metals with the electrically conductive metal oxides, inorganic electrically conductive substances (e.g. copper iodide, copper sulfide), organic electrically conductive materials (e.g. polyaniline, polythiophene, polypyrrole) and laminates of these organic electrically conductive materials with ITO. The anode is preferably formed from an electrically conductive metal oxide, and ITO is particularly preferred in view of productivity, high electrical conductivity, transparency, and the like.

The method for forming the anode can be arbitrary selected depending upon materials to be used. For example, when the material is ITO, the method can be selected from an electron beam method, a sputtering method, a resistance heating vapor deposition method, a chemical reaction method (sol-gel method, etc.), a method of applying a dispersion of indium tin oxide, or the like. Treatments such as washing, etc., may be applied to the anode, for reducing the driving voltage of the light-emitting device or improving the device in light emission efficiency. For example, when the anode is formed from ITO, UV-ozone treatment, plasma treatment, and the like, are effective. The anode is preferably adjusted to have a sheet resistance of several hundreds Ω/square or less. While the film thickness of the anode can be arbitrary selected depending upon materials to be used, generally, the film thickness is preferably 10 nm to 5 μm, more preferably 50 nm to 1 μm, and particularly preferably 100 nm to 500 nm.

Generally, the anode is formed on a substrate formed of a soda lime glass, an alkali-free glass, a transparent resin, or the like. When a glass substrate is used, it is preferred to use an alkali-free glass, for decreasing an ion elution from the glass. When a soda lime glass is used, preferably, a barrier coating of silica, or the like is formed on the surface thereof in advance. The thickness of the substrate is not specially limited so long as mechanical strength can be fully maintained. When a glass substrate is used, the thickness thereof is generally 0.2 mm or more, preferably 0.7 mm or more.

(B) Cathode

The cathode is for supplying electrons to the electron-injecting layer, the electron-transporting layer, the light-emitting layer, and the like. The material for the cathode can be selected from a metal, an alloy, a metal halide, a metal oxide, an electrically conductive compound, or mixtures of these. The material can be selected by taking account of adhesion to adjacent layers such as the light-emitting layer; an ionization potential, stability, and the like.

Specific examples of the above material include alkali metals (e.g. lithium (Li), sodium (Na), potassium (K)) or fluorides and oxides of these, alkaline earth metals (e.g. magnesium (Mg), calcium (Ca)) or fluorides and oxides of these, gold, silver, lead, aluminum, alloys or metal mixtures formed from sodium and potassium, alloys and metal mixtures formed from lithium and aluminum, alloys and metal mixtures formed from magnesium and silver, rare earth metals (e.g. indium, ytterbium) and mixtures of these. The cathode is preferably formed from a material having a work function of 4 eV or less, and it is more preferably formed from aluminum, an alloy or metal mixture of lithium and aluminum, or an alloy or metal mixture of magnesium and silver.

The cathode may have a single-layer structure formed from the above material(s) or may have an accumulated-layer structure containing layers formed from the above material(s). For example, the cathode preferably has an accumulated structure of aluminum/lithium fluoride, aluminum/lithium oxide, or the like. The cathode can be formed by an electron beam method, a sputtering method, a resistance heating vapor deposition method, a coating method, or the like. When a vapor deposition method is employed, a single material may be deposited, or two or more materials may be deposited at the same time. When an alloy electrode is formed, a plurality of metals can be deposited at the same time, to form the electrode, or an alloy prepared in advance may be deposited. The sheet resistance of the cathode is preferably several hundreds Ω/square or less. While the film thickness of the cathode can be determined depending upon materials to be used, generally, the film thickness is preferably 10 nm to 5 μm, more preferably 50 nm to 1 μm, particularly preferably 100 nm to 1 μm.

(C) Hole-Injecting Layer and Hole-Transporting Layer

The material for the hole-injecting layer and the hole-transporting layer may be any material as long as it has any of the function to inject holes from the anode, the function to transport holes, and the function to be a barrier against electrons injected from the cathode. Specific examples of the above material include carbazole, triazole, oxazole, oxadiazole, imidazole, polyarylalkane, pyrazoline, pyrazolone, phenylenediamine, arylamine, amino-substituted chalcone, styryl anthracene, fluorenone, hydrazone, stilbene, silazane, an aromatic tertiary amine compound, a styrylamine compound, an aromatic dimethylidyne-series compound, a porphyrin-series compound, a polysilane-series compound, poly(N-vinylcarbazole), an aniline-series copolymer, an electrically conductive polymer such as thiophene oligomer or polythiophene, organosilane, a compound represented by the above formula (2), a derivative thereof, carbon, and the like.

Each of the hole-injecting layer and the hole-transporting layer may have a single-layer structure formed from one or more of the above materials or may have a multi-layer structure formed of a plurality of layers having the same composition or different compositions. The method for forming the hole-injecting layer and the hole-transporting layer can be selected from a vacuum vapor deposition method, an LB method, a method in which the above material is dissolved or dispersed in a solvent and the solution or dispersion is applied to form a coating (a spin coating method, a casting method, a dip-coating method, or the like), an inkjet method, a printing method, a transfer method, and the like. In the coating method, the above material may be dissolved or dispersed together with a resin component, to prepare a coating solution or dispersion. The above resin component can be selected from a polyvinyl chloride, a polycarbonate, a polystyrene, a polymethyl methacrylate, a polybutyl methacrylate, a polyester, a polysulfone, a polyphenylene oxide, a polybutadiene, a poly(N-vinylcarbazole), a hydrocarbon resin, a ketone resin, a phenoxy resin, a polyamide, an ethyl cellulose, a polyvinyl acetate, an ABS resin, a polyurethane, a melamine resin, an unsaturated polyester resin, an alkyd resin, an epoxy resin, a silicon resin, and the like. While the film thickness of each of the hole-injecting layer and the hole-transporting layer is not particularly limited, generally, the above thickness is preferably 1 nm to 5 nm, more preferably 5 m to 1 μm, and particularly preferably 10 nm to 500 nm.

(D) Light-Emitting Layer

When an electric field is applied to a light-emitting device, holes injected from an anode, a hole-injecting layer or a hole-transporting layer and electrons injected from a cathode, an electron-injecting layer or an electron-transporting layer are recombined in the light-emitting layer, to emit light. The material for constituting the light-emitting layer is not particularly limited so long as it can form a layer having the function to receive holes from the anode or the like, the function to receive electrons from the cathode or the like, the function to transfer a charge, and the function to provide a site for recombination of the holes and electrons, to emit light, upon application of an electric field. The material for the light-emitting layer can be selected, for example, from benzoxazole, benzoimidazole, benzothiazole, styrylbenzene, polyphenyl, diphenylbutadiene, tetraphenylbutadiene, naphthalimide, coumarin, perylene, perynone, oxadiazole, aldazine, pyralidine, cyclopentadiene, bisstyrylanthracene, quinacridon, pyrrolopyridine, thiadiazolopyridine, styrylamine, an aromatic dimethylidyne compound, a metal complex (e.g. a metal complex of 8-quinolinol derivative), a polymer light-emitting material (e.g. polythiophene, polyphenylene, polyphenylenevinylene), organic silane, a transition metal complex (e.g. iridium trisphenylpyridine complex, platinum porphyrin complex), or a derivative of these. Preferably, at least one of materials constituting the light-emitting layer is a phosphorescent material.

The light-emitting layer may be formed from a single material or a plurality of materials. There may be employed a single light-emitting layer or a plurality of light-emitting layers. When a plurality of light-emitting layers are provided, each light-emitting layer may be formed from a single material or a plurality of materials. Further, a plurality of light-emitting layers may emit light in different colors, to emit white light or the like, or a single light-emitting layer may emit white light.

The method for forming the light-emitting layer is not particularly limited, and it can be selected from a resistance heating vapor deposition method, an electron beam method, a sputtering method, a molecular stacking method, a coating method (a spin coating method, a casting method, a dip coating method, or the like), an inkjet method, a printing method, an LB method, a transfer method, or the like. Of these, a resistance heating vapor deposition method and a coating method are preferred. The film thickness of the light-emitting layer is not specially limited, and generally, it is preferably 1 nm to 5 μm, more preferably 5 nm to 1 μm, and particularly preferably 10 nm to 500 mm.

(E) Electron-Injecting Layer and Electron-Transporting Layer

The material for forming the electron-injecting layer and the electron-transporting layer can be any material that has any of the function to inject electrons from the cathode, the function to transport electrons, and the function to be a barrier against holes injected from the anode. Specific examples thereof include triazole, oxazole, oxadiazole, imidazole, fluorenone, anthraquinodimethane, anthrone, diphenylquinone, thiopyran dioxide, carbodiimide, fluorenylidenemethane, distyrylpyrazine, naphthalene, tetracarboxylic acid anhydrides of an aromatic ring, such as perylene; pthalocyanine, metal complexes (e.g. metal complex of 8-quinolinol derivative, metal phthalocyanine, metal complexes having benzooxazole or benzothiazole as a ligand), organosilane, compounds represented by the above formula (2), derivatives of these, and the like.

Each of the electron-injecting layer and the electron-transporting layer may have a single-layer structure formed from one or more of the above materials, or may be a multi-layer structure formed of a plurality of layers having the same composition or different compositions. The method for forming the electron-injecting layer and the electron-transporting layer can be selected from a vacuum vapor deposition method, an LB method, a method in which the above material is dissolved or dispersed in a solvent and the solution or dispersion is applied to form a coating (a spin coating method, a casting method, a dip coating method, or the like), an inkjet method, a printing method, a transfer method, or the like. When a coating method is employed, the above material may be dissolved or dispersed together with a resin component, to prepare a coating solution or dispersion. The above resin component can be selected from those that are mentioned for the hole-injecting layer and the hole-transporting layer. The film thickness of each of the electron-injecting layer and the electron-transporting layer is not specially limited, and generally, it is preferably 1 nm to 5 μm, more preferably 5 nm to 1 μm, particularly preferably 10 nm to 500 nm.

(F) Protective Layer

The protective layer has the function to inhibit the penetration of substances that promotes deterioration of device, such as water and oxygen, from entering the device. The material for the protective layer can be selected from metals (e.g. indium (In), tin (Sn), lead (Pb), gold (Au), copper (Cu), silver (Ag), aluminum (Al), titanium (Ti), nickel (Ni)), metal oxides (e.g. MgO, SiO, $SiO_2$, $Al_2O_3$, GeO, NiO, CaO, BaO, $Fe_2O_3$, $Y_2O_3$, $TiO_2$), metal fluorides (e.g. $MgF_2$, LiF, $AlF_3$, $CaF_2$), nitrides (e.g. $SiN_x$, $SiO_xN_y$), polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene; a copolymer obtained by copolymerization of a monomer mixture containing tetrafluoroethylene and at least one comonomer; a fluorine-containing copolymer having a cyclic structure in the copolymer main chain; a water-absorptive substance having a water absorption rate of 1% or more, a moisture-proof substance having a water absorption rate of 0.1% or less, or the like.

The method for forming the protective layer is not particularly limited, and it can be selected from a vacuum vapor deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method, a coating method, a printing method, a transfer method, or the like. The compound represented by formula (2) according to the present invention, can be synthesized by a method described in Angew, Chem., 87, 746 (1975) or a method described in chem. Ber., 36, 1607(1997).

The organic electroluminescent device of the present invention exhibits excellent light emission properties and has excellent durability.

The light-emitting device of the present invention is suitable as a blue light-emitting device and a multiple color light-emitting device. Further, the tetraphenylene derivative according to the present invention is suitable as an electron-transporting material and/or host material for an organic electroluminescent device.

The organic electroluminescent device of the present invention has high external quantum efficiency and excellent light emission properties and can be applied to a blue light-emitting device and a white light-emitting device having high color purities, so that it can be suitably used in a display device, a display, a backlight, electrophotography, an illumination light source, a recording light source, an exposure light source, a reading light source, an indicator, a signboard, interior decoration, optical communication, and the like.

The present invention will be explained further in detail hereinafter, while the present invention shall not be limited thereto.

EXAMPLES

Example 1

A cleaned ITO substrate was placed in a vapor deposition apparatus, TPD (N,N'-diphenyl-N,N'-di(m-tolyl)benzidine was vapor-deposited to a thickness of 40 nm, and Exemplified compounds (2-3) and Compound b were vapor-codeposited thereon in a mass ratio of 17:1 to a thickness of 20 nm. Further, the following azole compound c was vapor-deposited thereon to a thickness of 40 nm. A mask that was patterned to have a light-emitting area of 4 mm×5 mm was placed on the thus-obtained organic thin film, and magnesium and silver (magnesium:silver=10:1 (mass ratio)) was vapor-codeposited to a thickness of 50 nm, in the vapor deposition apparatus. Then, silver was vapor deposited to a thickness of 50 nm, to obtain a light-emitting device of Example 1.

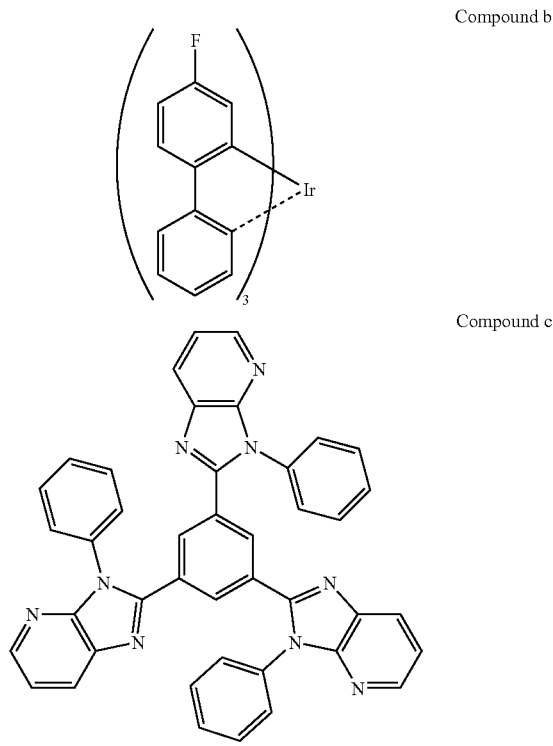

Compound b

Compound c

A DC constant voltage was applied to the above-obtained light-emitting device of Example 1 with a "Source Measure Unit 2400 model" (trade name) manufactured by Toyo Corporation, to cause the device to emit light, and the emitted light was measured for emission brightness with a "luminance meter BM-8" (trade name) manufactured by TOPCON Corporation and measured for emission wavelength with a "spectral analyzer PMA-11" (trade name)

manufactured by Hamamatsu Photonics Corporation. As a result, blue light emission was obtained, and the external quantum efficiency was 4.2%. The external quantum efficiency was calculated from the emission brightness, the emission spectrum, the current density, and the relative luminous efficiency curve.

Example 2

A light-emitting device of Example 2 was prepared in the same manner as in the above Example 1, except that Exemplified compound (2-3) was replaced with Exemplified compound (2-2). When the light-emitting device of Example 2 was measured for emission brightness in the same manner as in Example 1, blue light emission was obtained and the external quantum efficiency was 3.9%.

Example 3

A light-emitting device of Example 3 was prepared in the same manner as in the above Example 1, except that Exemplified compound (2-3) was replaced with Exemplified compound (2-10). When the light-emitting device of Example 3 was measured for emission brightness in the same manner as in Example 1, blue light emission was obtained and the external quantum efficiency was 1.2%.

Comparative Example 1

A light-emitting device of Comparative example 1 was prepared in the same manner as in the above Example 1, except that Exemplified compound (2-3) was replaced with the following compound a. When the light-emitting device of Comparative example 1 was measured for emission brightness in the same manner as in Example 1, blue light emission having a chromaticity value of (0.21, 0.53) was obtained, and the external quantum efficiency was 1.2%.

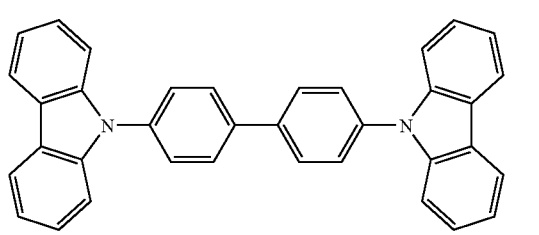

Compound a

Comparative Example 2

A light-emitting device of Comparative example 2 was prepared in the same manner as in the above Example 1, except that Exemplified compound (2-3) was replaced with the following compound d. When the light-emitting device of Comparative example 2 was measured for emission brightness and emission wavelength in the same manner as in Example 1, blue light emission having a chromaticity value of (0.18, 0.38) was obtained, and the external quantum efficiency was 0.3%.

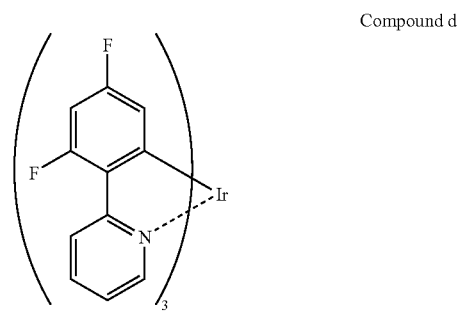

Compound d

Example 4

A light-emitting device of Example 4 was prepared in the same manner as in the above Example 1, except that the compound b was replaced with the following compound f and that the compound c was replaced with Exemplified compound (2-3). The light-emitting device of Example 4 was measured for emission brightness in the same manner as in Example 1, and as a result, the external quantum efficiency was 7.9%.

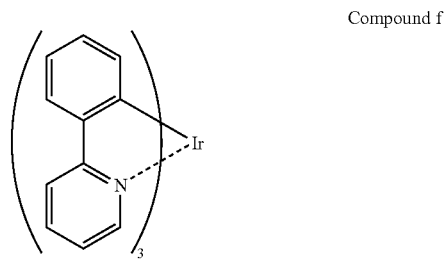

Compound f

Example 5

A light-emitting device of Example 5 was prepared in the same manner as in the above Example 4, except that Exemplified compound (2-3) was replaced with Exemplified compound (2-2). The light-emitting device of Example 5 was measured for emission brightness in the same manner as in Example 1, and as a result, the external quantum efficiency was 9.0%.

Example 6

A light-emitting device of Example 6 was prepared in the same manner as in the above Example 4, except that Exemplified compound (2-3) was replaced with Exemplified compound (2-10). The light-emitting device of Example 6 was measured for emission brightness in the same manner as in Example 1, and as a result, the external quantum efficiency was 8.1%.

Comparative Example 3

A light-emitting device of Comparative example 3 was prepared in the same manner as in the above Example 4, except that Exemplified compound (2-3) was replaced with the following compound h. The light-emitting device of Comparative example 3 was measured for emission brightness in the same manner as in Example 1, and as a result, the external quantum efficiency was 6.5%.

Compound h

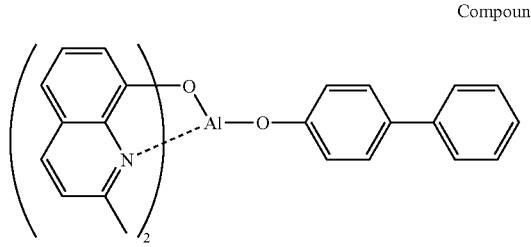

Example 7

A cleaned ITO substrate was placed in a vapor deposition apparatus, TPD was vapor-deposited to a thickness of 40 nm, and Exemplified compound (2-3) and the following compound g were vapor-codeposited thereon in a mass ratio of 17:1 to a thickness of 5 nm. Exemplified compound (2-2) and the compound b were vapor-codeposited thereon in a mass ratio of 17:1 to a thickness of 15 nm, and Exemplified compound (2-3) was further vapor-deposited thereon to a thickness of 40 nm. A mask that was patterned to have a light-emitting area of 4 mm×5 mm was placed on the thus-obtained organic thin film, and lithium fluoride was vapor-deposited to a thickness of 3 nm in the vapor deposition apparatus. Then, aluminum was vapor-deposited to a thickness of 60 nm, to obtain a light-emitting device of Example 7. The light-emitting device of Example 7 was measured for emission brightness and emission wavelength in the same manner as in Example 1, and as a result, white light emission having a chromaticity value of (0.33, 0.32) was obtained. The external quantum efficiency of the light-emitting device was calculated to give 3.1%.

Compound g

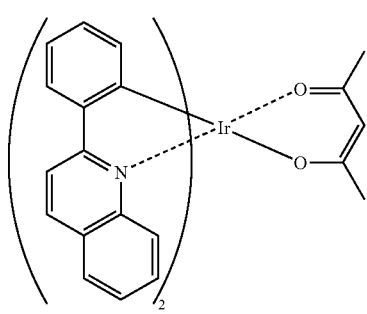

Example 8

A Baytron P (PEDOT-PSS (polyethylene dioxythiophene doped with polystyrenesulfonic acid) solution, manufactured by Bayer AG) was spin-coated on a cleaned ITO substrate (1,000 rpm, 30 sec.), and the resultant coating was vacuum-dried at 150° C. for 1.5 hours, to give an organic layer having a thickness of 70 nm. Then, 18 mg of Exemplified compound (2-2) and 2 mg of the compound b were dissolved in 1.5 ml of dichloroethane, and the solution was spin-coated on the above organic layer, to form an organic thin film having a thickness of 110 nm. The thus-obtained product in process was placed in a vapor deposition apparatus, and Exemplified compound (2-3) was vapor-deposited on the organic thin film to a thickness of 40 mm. Then, a mask that was patterned to have a light-emitting area of 4 mm×5 mm was placed thereon, and lithium fluoride was vapor-deposited to a thickness of 3 nm in the vapor deposition apparatus. Then, aluminum was vapor-deposited to a thickness of 60 nm, to obtain a light-emitting device of Example 8. The light-emitting device of Example 8 was measured for emission brightness and emission wavelength in the same manner as in Example 1. As a result, blue light emission was obtained, and the maximum brightness was 1,100 cd/m².

Having described our invention as related to the present embodiments, it is our intention that the invention not be limited by any of the details of the description, unless otherwise specified, but rather be construed broadly within its spirit and scope as set out in the accompanying claims.

What we claim is:

1. An organic electroluminescent device, which comprises:
   at least one organic layer between a pair of electrodes, with at least one layer of the at least one organic layer being a light-emitting layer, and
   at least one compound selected from the group consisting of (a) a compound having a structure represented by formula (2) and (b) a compound having, as its partial structure, a group corresponding to (a), in at least one layer of the at least one organic layer:

formula (2)

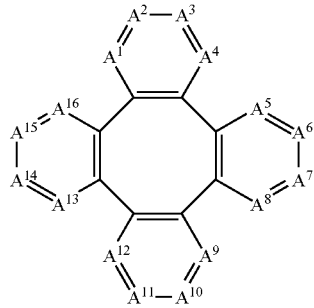

wherein, in formula (2), each of $A^1$, $A^2$, $A^3$, $A^4$, $A^5$, $A^6$, $A^7$, $A^8$, $A^9$, $A^{10}$, $A^{11}$, $A^{12}$, $A^{13}$, $A^{14}$, $A^{15}$, and $A^{16}$ represents a nitrogen atom or a carbon atom that may optionally have a substituent, and at least one of $A^1$, $A^2$, $A^3$, $A^4$, $A^5$, $A^6$, $A^7$, $A^8$, $A^9$, $A^{10}$, $A^{11}$, $A^{12}$, $A^{13}$, $A^{14}$, $A^{15}$, and $A^{16}$ is a nitrogen atom.

2. The organic electroluminescent device as claimed in claim 1, wherein the compound having a structure represented by formula (2) has one tetraphenylene structure.

3. The organic electroluminescent device as claimed in claim 1, wherein the compound having, as its partial structure, a group corresponding to (a) is a compound selected from a bonded compound, an oligomer compound, and a polymer compound, in each of which a plurality of compounds having a structure represented by formula (2) bond together.

4. The organic electroluminescent device as claimed in claim 1, wherein, in a tetraphenylene structure of the at least one compound selected from the group consisting of (a) a compound having a structure represented by formula (2) and (b) a compound having, as its partial structure, a group corresponding to (a), the number of nitrogen atoms that one six-membered ring has is 2 or less.

5. The organic electroluminescent device as claimed in claim 1, wherein, of six-membered rings forming the tetraphenylene structure of the at least one compound selected from the group consisting of (a) a compound having a structure represented by formula (2) and (b) a compound having, as its partial structure, a group corresponding to (a), a six-membered ring having a nitrogen atom has no substituent.

6. The organic electroluminescent device as claimed in claim 1, containing a phosphorescent material.

7. The organic electroluminescent device as claimed in claim 6, wherein the phosphorescent material and the at least one compound selected from the group consisting of (a) a compound having a structure represented by formula (2) and (b) a compound having, its partial structure, a group corresponding to (a) are contained in the same layer.

8. The organic electroluminescent device as claimed in claim 6, wherein the phosphorescent material is a transition metal complex.

9. The organic electroluminescent device as claimed in claim 1, wherein at least one atom selected from $A^1$, $A^4$, $A^5$, $A^8$, $A^9$, $A^{12}$, $A^{13}$, and $A^{16}$ is a nitrogen atom.

10. The organic electroluminescent device as claimed in claim 1, wherein $T_1$ level, an energy level in a lowest triplet excitation state of the at least one compound selected from the group consisting of (a) a compound having a structure represented by formula (2) and (b) a compound having, as its partial structure, a group corresponding to (a), is at least 188.3 kJ/mol but not more than 355.6 kJ/mol.

11. The organic electroluminescent device as claimed in claim 1, wherein the at least one compound selected from the group consisting of (a) a compound having a structure represented by formula (2) and (b) a compound having, as its partial structure, a group corresponding to (a) is contained in an electron-transporting layer or the light-emitting layer.

12. The organic electroluminescent device as claimed in claim 1, wherein a light emission maximum wavelength of the organic electroluminescent device is 390 nm to 495 nm.

13. The organic electroluminescent device as claimed in claim 1, wherein the substituent is selected from the group consisting of a halogen atom, an alkyl group, a cycloalkyl group, a bicycloalkyl group, an alkenyl group, a cycloalkenyl group, a bicycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, a sulfamoylamino group, an alkylsulfonylamino, an arylsulfonylamino group, a mercapto group, an alkylthio group, an arylthio group, a heterocyclic thio group, a sulfamoyl group, a sulfo group, an alkylsulfinyl, an arylsulfinyl group, an alkylsulfonyl, an arylsulfonyl group, an acyl group, an aryloxycarbonyl group, an alkoxycarbonyl group, a carbamoyl group, an arylazo, a heterocyclic azo group, an imido group, a phosphino group, a phosphinyl group, a phosphinyloxy group, a phosphinylamino group, and a silyl group.

14. The organic electroluminescent device as claimed in claim 1, wherein the substituent is selected from the group consisting of an alkyl group having 1 to 3 carbon atoms, a halogen atom, a substituted or unsubstituted aryl group having 6 to 12 carbon atoms, and a substituted or unsubstituted heterocyclic group having 1 to 10 carbon atoms.

15. A display comprising the organic electroluminescent device as claimed in claim 1.

* * * * *

UNITED STATES PATENT AND TRADEMARK OFFICE
CERTIFICATE OF CORRECTION

| | | |
|---|---|---|
| PATENT NO. | : 7,282,276 B2 | Page 1 of 1 |
| APPLICATION NO. | : 11/266303 | |
| DATED | : October 16, 2007 | |
| INVENTOR(S) | : Osamu Uchida et al. | |

It is certified that error appears in the above-identified patent and that said Letters Patent is hereby corrected as shown below:

On the (title page), after Item "(65) Prior Publication Data", please add item "(30) Foreign Application Priority Data" as follows:

-- (30) Foreign Application Priority Data

Nov. 8, 2004 (JP) ........................... 2004-323716 --

Signed and Sealed this
Twenty-fifth Day of January, 2011

David J. Kappos
*Director of the United States Patent and Trademark Office*